United States Patent [19]

Glenart et al.

[11] Patent Number: 4,734,645
[45] Date of Patent: Mar. 29, 1988

[54] NMR MAGNETOMETER PROBE WITH A TUNEABLE CAVITY IN ITS CENTER AND A DOUBLE CENTRAL CYLINDRICAL MEMBER

[75] Inventors: Henri Glenart, Corenc; Nelly Kernevez, Grenoble; Claude Sonrel, Brie et Angonnes, all of France

[73] Assignee: Commissariat a l'energie Atomique, Paris, France

[21] Appl. No.: 873,720

[22] Filed: Jun. 12, 1986

[30] Foreign Application Priority Data

Jun. 21, 1985 [FR] France .................. 85 09488

[51] Int. Cl.[4] ........................................... G01R 33/00
[52] U.S. Cl. ..................................... 324/301; 324/300
[58] Field of Search ............... 324/301, 302, 304, 316, 324/322, 300; 333/231

[56] References Cited

U.S. PATENT DOCUMENTS

| 3,131,345 | 4/1964 | Abragam et al. | 324/322 |
| 3,145,336 | 8/1964 | Bonnet et al. | 324/322 |
| 3,501,690 | 3/1970 | Salvi et al. | 324/301 |
| 3,735,246 | 5/1973 | Glenat et al. | 324/301 |

FOREIGN PATENT DOCUMENTS 2092998  1/1972  France .
2098624  3/1972  France .

Primary Examiner—Stewart J. Levy
Assistant Examiner—Louis M. Arana
Attorney, Agent, or Firm—Oblon, Fisher, Spivak, McClelland & Maier

[57] ABSTRACT

NMR magnetometer probe with a tuneable cavity in its center and a double central cylindrical member. The tuning element of the cavity is a capacitor placed in the center of the resonant cavity between two half sections of the central conductor. This capacitor is regulatable and a magnetic being accessible through an opening. Application to the measurement of magnetic fields, particularly the geomagnetic field.

5 Claims, 4 Drawing Figures

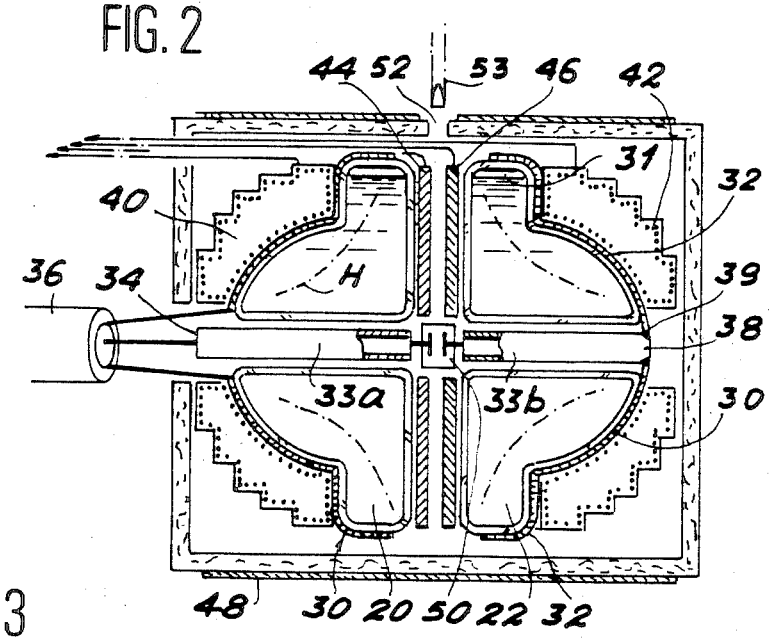
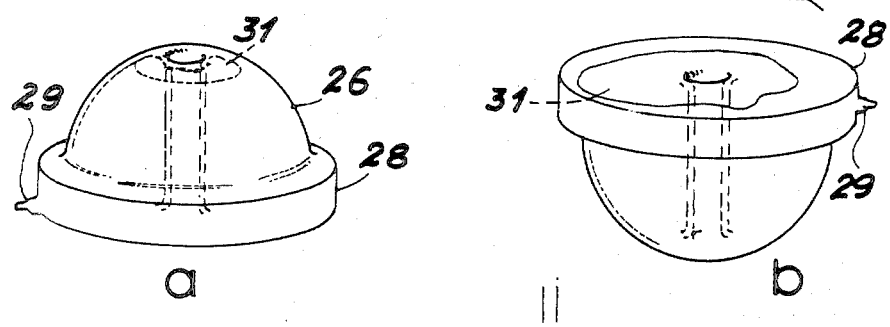
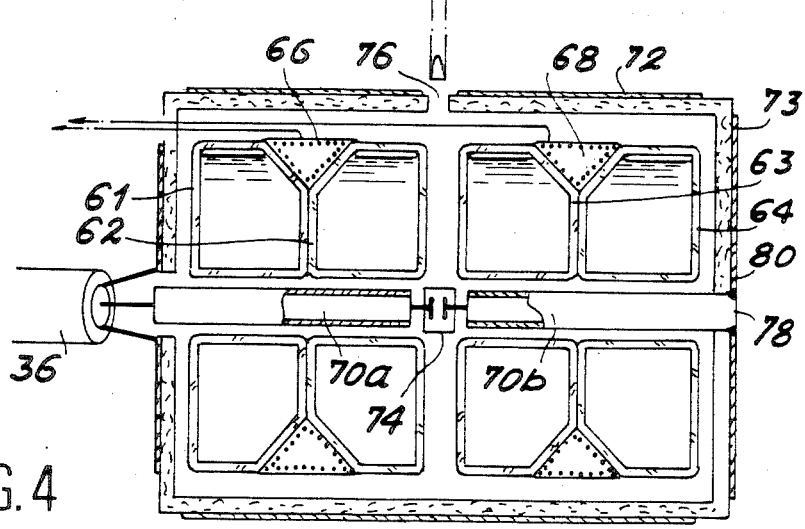

NMR MAGNETOMETER PROBE WITH A TUNEABLE CAVITY IN ITS CENTER AND A DOUBLE CENTRAL CYLINDRICAL MEMBER

BACKGROUND OF THE INVENTION

The present invention relates to a nuclear magnetic resonance (NMR) magnetometer probe. It is used in the precise measurement of magnetic fields, particularly the geomagnetic field, whose value is $5.10^{-5}$ Tesla or 50,000 gammas, the gamma being a particularly suitable unit for use in the envisaged application (1 gamma = $10^{-9}$ Tesla).

The magnetometer in which the invention is used is of the spin coupling oscillator type without a forbidden axis. Such an apparatus is known and is more particularly described in French patent application Nos. 1 447 226 and 2 098 624. There is consequently no need to provide a detailed description of such an apparatus here. It is merely pointed out that this apparatus comprises (according to FIG. 1) at least two liquid samples contained in bottles (four in the illustrated variant, i. e. 2. 4. 6. 8), said bottles being placed in a very high frequency resonant cavity. The latter is constituted by a central conductor 10 and an outer conductive wall 12, the central conductor and wall being connected to a coaxial cable 14 connected to a not shown VHF generator. The probe also comprises windings 16, 18 for sampling and reinjecting a signal at the Larmor frequency defined on the one hand by the magnetic field in which the probe is located and on the other by the natural gyromagnetic ratio of the samples used.

In this connection it is pointed out that the term "sample" designates a solvent mass having atomic nuclei with a magnetic moment and angular momentum of a non-zero nature, i.e. with a well defined gyromagnetic ration. This solvent contains in solution, a paramagnetic substance having at least one saturatable electronic line of resonance. The latter is excited by the very high frequency field established in the resonant cavity. As the resonant frequency of this cavity cannot be defined with sufficient accuracy, use is made of a tuneable member, normally of a capacitive nature, which makes it possible to adjust the resonant frequency in the laboratory.

In the aforementioned prior art and particularly FR-A No.2 098 624, the regulatable capacitive element has the shape shown in the right-hand part of FIG. 1. It is an e.g. quartz disk 15 having a central hole and which is coated on its outer face with silver-plated sectors 17 connected to the outer conductive wall 12. These sectors do not extend up to the central hole of the disk. On the inner face, the disk is coated with silver sectors of limited thickness 19, which face sectors 17. Sectors 19 are interconnected by a metal deposit 21, which covers the central hole and at the same time constitutes a connection to the central conductor 10.

The thus formed assembly acts as a capacitor, sectors 17 and 19 constituting the coatings and the quartz disk 15 the dielectric. This capacitor is inserted between the central conductor 10 and the outer wall 12 of the cavity. The adjustment of this capacitor consequently permits the regulation of the resonant frequency of the cavity, for which purpose the operator scratches to a greater or lesser extent the silver plating 17 covering disk 15.

Although satisfactory in certain respects, this regulating means suffers from disadvantages. Firstly, it is bound by the shape of the bottles used which, as can be seen in FIG. 1, are cylindrical. However, this is not always the case, because the shapes can vary widely and can e.g. be hemispherical. Moreover, the apparatus is essentially asymmetrical, because it is located at one end of the probe. It is also relatively complex and expensive, because it requires a quartz disk covered with silver-plated sectors. Finally and as will be made more apparent hereinafter, the inevitable presence of a bubble in the end bottle disturbs the regulation when the probe is in the vertical position, particularly in the case of hemispherical bottles.

SUMMARY OF THE INVENTION

The object of the present invention is to obviate these disadvantages by proposing a less expensive, simpler and symmetrical tuning means, which is not sensitive to the position of bubbles in the bottles.

According to the invention, the capacitive regulating element is constituted by at least one regulatable capacitor located in the centre of the cavity, between two halves of the central conductor of the cavity, the central conductor end not connected to the coaxial cable being directly connected to the conductive outer wall by a short-circuit.

BRIEF DESCRIPTION OF THE DRAWINGS

The invention is described in greater detail hereinafter relative to non-limitative embodiments and the attached drawings, wherein shown:

FIG. 2, a variant with two hemispherical bottles and four coils.

FIG. 3, a hemispherical bottle in two vertical positions.

FIG. 4, another variant with four bottles and two coils.

DETAILED DESCRIPTION OF THE PREFERRED EMBODIMENTS

Figure 1:
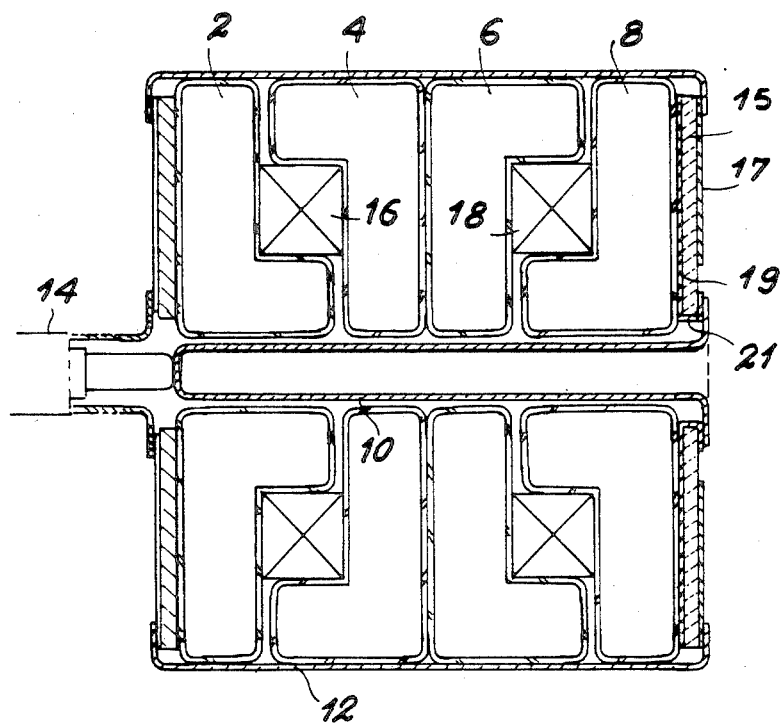
FIG. 1, already described, illustrates the prior art.

The probe shown in FIG. 2 comprises two bottles 20, 22, each of which is formed (cf FIG. 3) by a hemisphere 26 and a cylindrical member 28. These two bottles are externally coated by a silvered metal coating respectively 30, 32, constituted by non-contiguous strips (to prevent circumferential eddy currents). The probe also comprises a central conductor formed from two half-sections 33a, 33b, the left-hand end 34 of section 33a being connected to the central conductor of a coaxial cable 36 and the right-hand end 38 of section 33b being connected to the conductive coating 32 of bottle 22 by conductive strips 39.

The sampling and excitation windings of this probe comprise on the one hand two hemispherical windings 40, 42 and on the other two flat coils 44, 46. The hemispherical windings 40, 42 are obtained by winding onto a spherical template or former and impregnation by a resin. The staircase shape of the external zones results from the fact that turns located in these zones participate only slightly in the excitation and sampling of the measurement signal and have consequently been eliminated, which lightens the probe.

Windings 40, 42 on the one hand and coils 44, 46 on the other are wound and connected in such a way that the useful signals are increased or added and the interfering signals decreased or subtracted, as is explained in the aforementioned prior art. The special shape given to the windings in FIG. 2 leads to a magnetic field diagrammatically indicated by line H. As a result of this shape, no matter what the orientation of the probe relative to the field to be measured, there is always a sample volume for which the exciting field is not parallel to the field to be measured, which prevents any forbidden measuring axis.

The probe shown is completed by an external shielding 48 formed by metal strips deposited on an insulating support.

According to the invention, a regulatable capacitor 50 is placed between sections 33a, 33b of the central conductor. This capacitor is accessible from the outside via an opening 52 made in the shielding. A rod or the end of a screwdriver 53 makes it possible to manually adjust the value of the capacitance of the capacitor by passing between the two bottles 20, 22 and between the two flat coils 44, 46.

Naturally, as the capacitor 50 is located in the resonant cavity and is subject to the magnetic field to be measured, it must be strictly amagnetic.

FIG. 2 shows the perfect symmetry of of the apparatus and its simplicity. However, it has another interesting point, which is illustrated by FIG. 3. The latter shows a bottle with its hemispherical part 26 and its cylindrical member 28. An exhaust tube 29 is used for filling purposes and once this has been sealed, it constitutes a small protuberance on the side of the bottle. The bottle is never completely filled, because in order to permit the expansion of the liquid, a bubble 31 must be provided. When the bottle is positioned vertically, the hemispherical part being at the top (part a in FIG. 3), bubble 31 is located at the top of the hemisphere and occupies a relatively small surface. In the probe, this means that the bubble is located round the end 38 of the central conductor. In the prior art, it was this end which was used for adjusting the cavity frequency, so that the cavity was deregulated in the vertical position. This disadvantage is eliminated by the invention, because the regulating capacitor is located in the centre of the cavity.

Naturally, on considering the reverse position (part b), the bubble comes into contact with the flat wall of the cylindrical member of bottle 20 in the vicinity of the regulating zone. However, in this case, the surface offered to the bubble 31 is large, so that the latter is very thin and has substantially no effect on the regulation.

The invention is not only applicable to probes with hemispherical bottles and in fact applies to any type of probe. FIG. 4 in particular shows a probe with four bottles 61, 62, 63, 64 in which the samples are distributed in pairs, as described in the prior art. Two windings 66, 68 are positioned between the bottles. The resonant cavity is formed on the one hand by a central conductor constituted by two half-sections 70a, 70b and on the other by a conductive wall formed by silvered strips 72 on the cylindrical part of the probe and silvered sectors 73 on the two side walls.

According to the invention, an amagnetic, regulatable capacitor 74 is connected between the two half-sections 70a, 70b. This capacitor is accessible from the outside of the probe through an opening 76 made in the outer layer, a space being provided for this purpose between bottles 63, 62. The end 78 of section 70b is electrically connected by a metal sheet 80 to sectors 73 of the right-hand side wall.

What is claimed is:

1. A spin coupling nuclear magnetic resonance magnetometer probe without forbidden axis, said probe comprising:
    at least two liquid samples contained in at least two bottles,
    said bottles being placed in a very high frequency resonant cavity, which is constituted by a central conductor and an outer conductive wall, said central conductor comprising a first section having a first end adapted to be connected to a central conductor of coaxial cable and a second end, and a second section having a first end and a second end connected to the outer conductive wall by a short circuit, at least one regulatable capacitor connected between said second end of said first section and said first end of said second section, said regulatable capacitor permitting the regulation of the resonant frequency of the cavity, the probe also comprising at least two windings for sampling and reinjecting a signal at the Larmor frequency defined by the magnetic field in which the probe is located and by the gyromagnetic ratio of the samples used, said two windings surrounding at least part of the samples, 2. A probe according to claim 1, comprising: an outer wall covered with metallized strips said wall having an opening giving access to the capacitor for the manual regulation thereof from the outside.

3. A probe according to claim 1, wherein the regulatable capacitor is amagnetic.

4. A probe according to claim 1, comprising two bottles, each being shaped like a hemisphere joined to a flat cylindrical member, the two bottles facing one another, their flat cylindrical members facing one another, the bottles having the external wall thereof covered by conductive strips forming the outer wall of the resonant cavity, the regulating capacitor being located between the two cylindrical members of the two bottles.

5. A probe according to claim 4, wherein said two windings, surrounding at least part of the samples are each wound onto a hemispherical surface concentric to the hemispherical part of the bottles said probe comprising further two other windings in the form of flat coils placed between the two flat cylindrical members, said two other coils participating in the recovery of the signal and the improvement of the isotrophy of the probe, the regulatable capacitor being positioned between the said two other windings.

* * * * *